United States Patent
Masleid et al.

(10) Patent No.: US 7,173,455 B2
(45) Date of Patent: Feb. 6, 2007

(54) REPEATER CIRCUIT HAVING DIFFERENT OPERATING AND RESET VOLTAGE RANGES, AND METHODS THEREOF

(75) Inventors: Robert Paul Masleid, Monte Sereno, CA (US); Vatsal Dholabhai, Portola Valley, CA (US); Christian Klingner, San Jose, CA (US)

(73) Assignee: Transmeta Corporation, Santa Clara, CA (US)

( * ) Notice: Subject to any disclaimer, the term of this patent is extended or adjusted under 35 U.S.C. 154(b) by 0 days.

(21) Appl. No.: 10/879,808

(22) Filed: Jun. 28, 2004

(65) Prior Publication Data

US 2005/0270069 A1     Dec. 8, 2005

Related U.S. Application Data

(63) Continuation-in-part of application No. 10/864,271, filed on Jun. 8, 2004.

(51) Int. Cl.
*H03K 19/0175* (2006.01)
*H03K 19/094* (2006.01)

(52) U.S. Cl. .............................. 326/86; 326/23; 326/27

(58) Field of Classification Search ................. 326/86, 326/83, 23, 27; 327/112, 142
See application file for complete search history.

(56) References Cited

U.S. PATENT DOCUMENTS

| | | | | |
|---|---|---|---|---|
| 4,498,021 A | * | 2/1985 | Uya | ............................. 326/86 |
| 5,166,555 A | * | 11/1992 | Kano | ............................. 326/87 |
| 5,414,312 A | | 5/1995 | Wong | ............................. 326/83 |
| 5,497,105 A | | 3/1996 | Oh et al. | |
| 5,739,715 A | | 4/1998 | Rawson | |
| 5,767,700 A | * | 6/1998 | Lee | ............................. 326/86 |
| 6,025,738 A | | 2/2000 | Masleid | ........................ 326/83 |
| 6,114,840 A | | 9/2000 | Farrell et al. | |
| 6,577,176 B1 | | 6/2003 | Masleid et al. | ............. 327/199 |
| 6,731,140 B2 | | 5/2004 | Masleid et al. | ............... 327/99 |
| 2001/0030561 A1 | | 10/2001 | Asano et al. | |
| 2002/0056016 A1 | | 5/2002 | Horowitz et al. | |
| 2003/0160630 A1 | | 8/2003 | Earle | |
| 2003/0231713 A1 | | 12/2003 | Masleid et al. | ............. 375/259 |

OTHER PUBLICATIONS

Iima, T. et al.: "Capacitance Coupling Immune, Transient Sensitive Accelerator for Resistive Interconnect Signals of Subquarter Micro ULSI" IEEE Journal of Solid-Stage Circuits, IEEE Inc. New York, US, vol. 31, No. 4, Apr. 1, 1996 pp. 531-536 XP000597224 ISSN: 0018-9200, figures 2, 5, 6.

Nalamalpu A. et al.."Boosters for Driving Long Onchip Interconnects-Design Issues, Interconnect Synthesis, and Comparison with Repeaters" IEEE Transactions on Computer-Aided Design of Integrated Circuits and Systems, vol. 21, No. 1, Jan. 2002, pp. 50-62, XP01108067, ISSN: 0278-0070, figure 2.

* cited by examiner

*Primary Examiner*—Daniel D. Chang

(57) ABSTRACT

A circuit for assisting signal transitions on a wire, and a method thereof. A first subcircuit causes a first transistor that is coupled to the circuit's output to turn on during a rising transition and drive the output to a high state to assist in the rising transition. A second subcircuit causes a second transistor that is coupled to the circuit's output to turn on during a falling transition and drive the output to a low state to assist in the falling transition. A third subcircuit resets elements of the first subcircuit. The first subcircuit operates above a first voltage threshold and the third subcircuit operates below the first voltage threshold. A fourth subcircuit resets elements of the second subcircuit. The second subcircuit operates below a second voltage threshold and the fourth subcircuit operates above the second voltage threshold.

24 Claims, 8 Drawing Sheets

REPEATER CIRCUIT HAVING DIFFERENT OPERATING AND RESET VOLTAGE RANGES, AND METHODS THEREOF

RELATED UNITED STATES PATENT APPLICATIONS

This application is a Continuation-in-Part of U.S. patent application Ser. No. 10/864,271 by R. Masleid et al., filed on Jun. 8, 2004, entitled "Stacked Inverter Delay Chain," assigned to the assignee of the present invention, and hereby incorporated by reference in its entirety.

This application is related to U.S. patent application Ser. No. 10/879,807 by R. Masleid et al., filed on Jun. 28, 2004, entitled "Circuits and Methods for Detecting and Assisting Wire Transitions," assigned to the assignee of the present invention, and hereby incorporated by reference in its entirety.

This application is related to U.S. patent application Ser. No. 10/879,879 by R. Masleid et al., filed on Jun. 28, 2004, entitled "Repeater Circuit with High Performance Repeater Mode and Normal Repeater Mode," assigned to the assignee of the present invention, and hereby incorporated by reference in its entirety.

This application is related to U.S. patent application Ser. No. 10/879,645 by R. Masleid et al., filed on Jun. 28, 2004, entitled "Repeater Circuit with High Performance Repeater Mode and Normal Repeater Mode, Wherein High Performance Repeater Mode Has Fast Reset Capability," assigned to the assignee of the present invention, and hereby incorporated by reference in its entirety.

BACKGROUND OF THE INVENTION

1. Field of the Invention

Embodiments of the present invention relate to wire repeaters, and in particular to wire accelerators.

2. Related Art

A vital area of circuit performance is the propagation time of signals across a chip. Longer wires in chips resist the propagation of signals due to the resistance and capacitance of the wire. The propagation of signals across a chip can be improved by inserting an amplification circuit—sometimes referred to as buffering or repeater insertion—into the wire.

A wire accelerator is a type of wire repeater. A wire accelerator is intended to detect a transition in a wire and then help the transition. A problem with conventional wire accelerators is that, after helping achieve one transition, they continue to drive the wire and so resist the next transition.

SUMMARY OF THE INVENTION

Therefore, a wire accelerator that can both drive a wire and assist during wire transitions, without resisting the transitions, would be valuable. Embodiments in accordance with the present invention provide such a wire accelerator.

BRIEF DESCRIPTION OF THE DRAWINGS

The accompanying drawings, which are incorporated in and form a part of this specification, illustrate embodiments of the present invention and, together with the description, serve to explain the principles of the invention. The drawings referred to in this description should not be understood as being drawn to scale except if specifically noted.

DETAILED DESCRIPTION OF THE INVENTION

Reference will now be made in detail to the various embodiments of the invention, examples of which are illustrated in the accompanying drawings.

While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the present invention.

Circuits for Detecting and Assisting Wire Transitions

Figure 1:
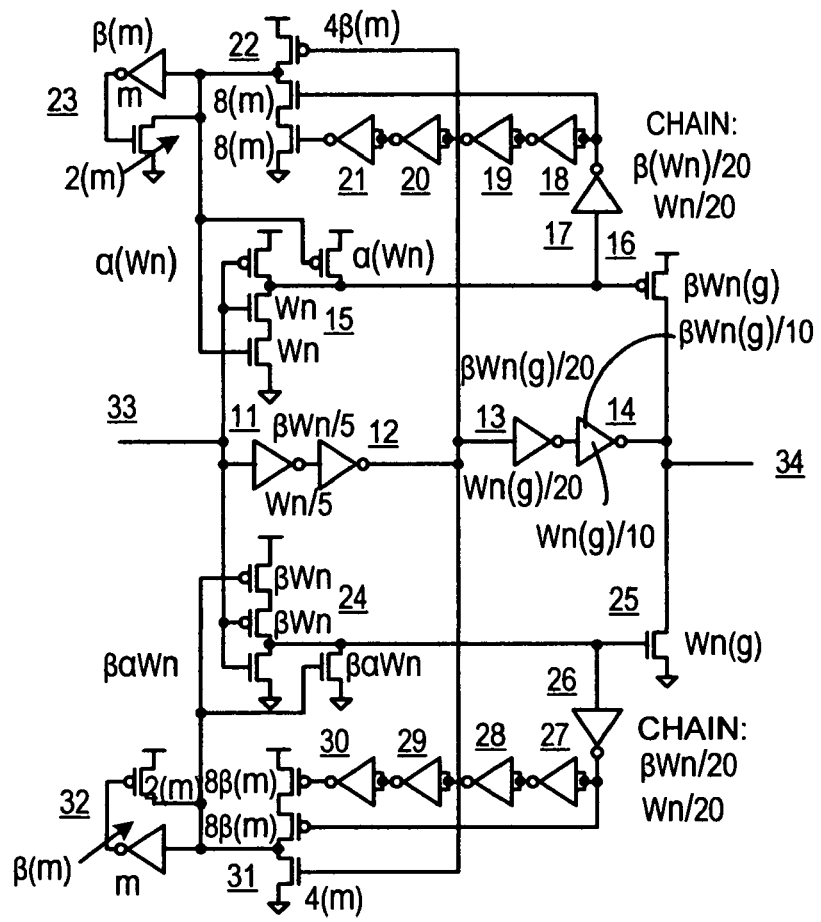
FIG. 1 illustrates a schematic of one embodiment of a circuit for assisting signal transitions in accordance with the present invention.

FIG. 1 illustrates a schematic of one embodiment of a circuit 10 for driving signals on a wire and for assisting signal transitions in accordance with the present invention. Circuit 10 can be coupled to the wire to function as a wire repeater or accelerator. As will be seen, circuit 10 provides the capability to detect a transition (e.g., a rising transition or falling transition) occurring on the wire and assist the transition, and then drive the wire after the transition without resisting a subsequent transition.

In the embodiment of FIG. 1, circuit 10 has an input node 33 and an output node 34 that are each coupled to the wire (specifically, a first part of the wire is connected to input node 33, and a second part of the wire is connected at output node 34). In an alternative embodiment, circuit 10 can be implemented in a lookaside configuration, in which the input node is connected to the output node, and together the input and output nodes are connected to the wire. Lookaside configurations are illustrated as circuits 35 and 36 in FIGS. 2 and 3, respectively.

In general, circuit 10 of FIG. 1 includes three subcircuits referred to herein as keeper circuitry, rising transition circuitry, and falling transition circuitry. In the example of FIG. 1, the keeper circuitry includes a delay chain consisting of gates (inverters) 11, 12, 13 and 14 coupled between the input node 33 and the output node 34.

In the present embodiment, the rising transition circuitry includes NAND gate 15, a delay chain consisting of inverter 17 and stacked inverters 18, 19, 20 and 21 (stacked inverters are described further in conjunction with FIG. 4 below); pseudo-inverter 22; and half latch 23. The rising detection circuitry drives an output transistor 16. In one embodiment, transistor 16 is a p-type device (e.g., a positive channel metal oxide semiconductor field effect transistor, or pFET).

Continuing with reference to FIG. 1, the falling transition circuitry includes NOR gate 24; a delay chain consisting of inverter 26 and stacked inverters 27, 28, 29 and 30; pseudo-inverter 31; and half latch 32. The falling detection circuitry drives an output transistor 25. In one embodiment, transistor 25 is an n-type device (e.g., a negative channel metal oxide semiconductor field effect transistor, or nFET).

Circuit 10 will be described in operation. From that discussion, it will be understood that the keeper circuitry, rising transition circuitry and falling transition circuitry are not limited to the elements illustrated and described by the example of FIG. 1. For example, half latches 23 and 32 can be replaced with full latches. Also, for example, the number of inverters in the delay chains can be different than that shown in the example of FIG. 1.

In general, the rising transition circuitry generates a pulse in response to receiving a rising input at input node 33 (in other words, upon detecting a rising transition, e.g., a rising edge, in a signal on a wire). The pulse operates the output transistor 16 for a period of time. Afterwards, the transistor 16 is shut off. While turned on, the transistor 16 drives the output node 34 to a high state.

In a similar manner, the falling transition circuitry generates a pulse in response to receiving a falling input at input node 33 (in other words, upon detecting a falling transition, e.g., a falling edge, in a signal on a wire). The pulse operates the output transistor 25 for a period of time. Afterwards, the transistor 25 is shut off. While turned on, the transistor 25 drives the output node 34 to a low state.

The keeper circuitry operates at a reduced drive strength relative to the rising and falling transition circuitry. The keeper circuitry maintains the state at the output node 34 in between operation of the transistors 16 and 25. That is, the keeper circuitry maintains a high state at output node 34 after transistor 16 is shut off (and before transistor 25 is turned on), and also maintains a low state at output node 34 after transistor 25 is turned off (and before transistor 16 is turned on).

More specifically, circuit 10 operates as follows. A rising input (a rising edge) at input node 33 causes the NAND gate 15 to fall, which activates the output transistor 16 and drives the output node 34 high. The fall of the NAND gate 15 also starts the delay chain in the rising transition circuitry (inverter 17, stacked inverters 18–21 and pseudo-inverter 22). The delay chain in the keeper circuitry (specifically, inverters 11–12) rises, drives half latch 32 low, and resets the falling transition circuitry. The NAND gate 15 then rises (after a period of time established by the delay chain in the rising transition circuitry), which deactivates the transistor 16. The rise of NAND gate 15 also releases half latch 23 so that it can be reset during a falling transition. After transistor 16 is shut off, the keeper circuitry keeps output node 34 high, until a falling transition is detected.

A falling input (a falling edge) at input node 33 causes the NOR gate 24 to rise, which activates the output transistor 25 and drives the output node 34 low. The rise of the NOR gate 24 also starts the delay chain in the falling transition circuitry (inverter 26, stacked inverters 27–30 and pseudo-inverter 31). The delay chain in the keeper circuitry (specifically, inverters 11–12) falls, drives half latch 23 high, and resets the rising transition circuitry. The NOR gate 24 then falls (after a period of time established by the delay chain in the falling transition circuitry), which deactivates the transistor 25. The fall of NOR gate 24 also releases half latch 32 so that it can be reset during a rising transition. After transistor 25 is shut off, the keeper circuitry keeps output node 34 low, until a rising transition is detected.

Thus, circuit 10 provides complementary edge detectors: the NAND gate and delay chain of the rising transition circuitry, and the NOR gate and delay chain of the falling transition circuitry. The rising transition resets the falling transition circuitry, and the falling transition resets the rising transition circuitry. The keeper circuitry in effect acts as memory to retain the current state of the overall circuit. In the example of FIG. 1, the keeper circuitry also resets the rising and falling transition subcircuits. For a 700 millivolt (mV) power supply, the rising and falling transition subcircuits are reset by the keeper circuitry at about 350 mV.

Circuit 10 is in effect a four-state driver: 1) at a rising transition, an internal pulse is generated and the state is driven high with a low impedance output transistor ("hard drive high"), assisting the rising transition; 2) followed by a higher impedance keep state which maintains the high state and helps drive the high signal on the wire; 3) followed by the state being driven low with a low impedance output transistor ("hard drive low"), assisting the falling transition; and 4) followed by another higher impedance keep state that maintains the low state and helps drive the low signal on the wire.

In FIG. 1, 'Wn' refers to the depletion layer width, and 'm' refers to the minimum device size (width). Different values of Wn are contemplated, and device widths are generally proportional to Wn. If a value of Wn results in a device width less than the minimum, the device width is clamped at the minimum. In the stacked inverters 18–21 and 27–30, there may be both p-type devices and n-type devices (see FIG. 4); hence, in FIG. 1, two sets of dimensions are shown for the elements of the delay chains (the dimension that includes the β term is for p-type devices, and the other is for n-type devices).

In one embodiment, the gate width-to-length ratio (β) is 1.7 (the basic strength ratio of P to N), the scaling factor (α) is ⅙ (the beta skew factor for skewed stages), and the transconductance (g) is 8 (the gain ratio between internal stages). Such values are exemplary; the present invention is not so limited.

However, and importantly, dimensions are selected so that the keeper circuitry does not interfere with a transition. That is, the keeper circuitry can maintain the state at the output node 34, but is weak enough so that it can be overcome by a wire transition. The transistors 16 and 25 are turned off between transitions, so the rising transition circuitry and falling transition circuitry also do not interfere with a transition.

Figure 2:
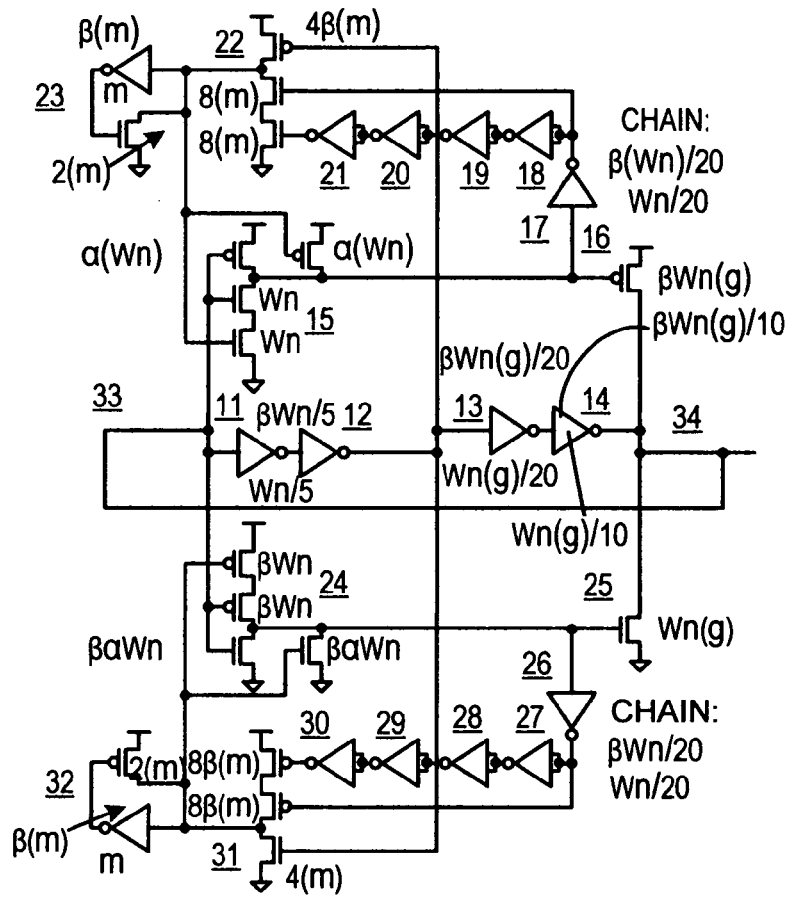
FIG. 2 illustrates a schematic of another embodiment of a circuit for assisting signal transitions in accordance with the present invention.

FIG. 2 illustrates a schematic of an embodiment of a circuit 35 for driving wire signals and assisting signal transitions in accordance with the present invention. Circuit 35 differs from circuit 10 of FIG. 1 in that the input node 33 and output node 34 of circuit 35 are connected to each other in a lookaside configuration. Elements common to circuits 10 and 35 are numbered the same. Circuit 36 can be implemented as a lookaside wire repeater or accelerator when coupled to a wire on a chip, functioning in a manner similar to circuit 10.

Figure 3:
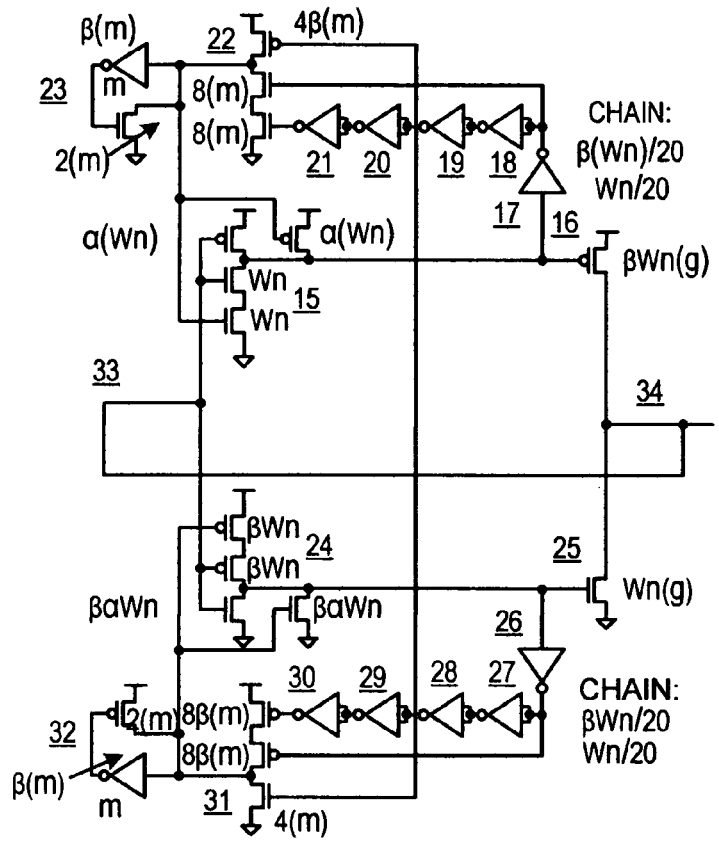
FIG. 3 illustrates a schematic of yet another embodiment of a circuit for assisting signal transitions in accordance with the present invention.

FIG. 3 illustrates a schematic of an embodiment of a circuit 36 for assisting signal transitions in accordance with the present invention. Circuit 36 differs from circuit 35 of FIG. 2 in that circuit 36 does not include keeper circuitry (e.g., inverters 11–14 of circuit 35 are not present in circuit 36). Elements common to circuits 35 and 36 are numbered the same. Circuit 36 can be implemented as a lookaside wire repeater when coupled to a wire on a chip, functioning in a manner similar to circuit 35 except for maintaining state at the output node between rising and falling transitions. In a similar manner, the keeper circuitry may not be included in circuit 10 of FIG. 1.

Figure 4:
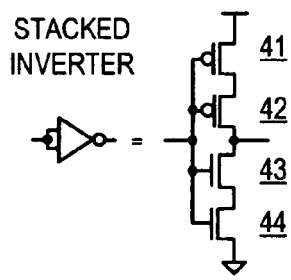
FIG. 4 illustrates a schematic of one embodiment of a stacked inverter in accordance with the present invention.

FIG. 4 illustrates a schematic of one embodiment of a stacked inverter 40 in accordance with the present invention. In contrast to a conventional inverter, stacked inverter 40 includes more than a single p-type device coupled to a single n-type device. Rather, stacked inverter 40 includes multiple p-type devices and multiple n-type devices. In the example of FIG. 4, stacked inverter 40 includes two p-type devices 41 and 42, and two n-type devices 43 and 44; however, the present invention is not limited to either that combination of devices or that number of devices. The gates of the p-type and n-type devices are coupled to form the input of stacked inverter 40.

The p-type devices are configured to pull the output high (when appropriate) and the n-type devices are configured to pull the output low. Consequently, the drive capability of stacked inverter 40 is less than the drive capability of a conventional inverter. Beneficially, such decreased drive capability produces an increased delay of a signal through stacked inverter 40. Additionally, stacked inverter 40 presents an increased load to its driving circuitry in comparison to a conventional inverter. For example, a signal input to stacked inverter 40 is coupled to four active devices as opposed to being coupled to two active devices in a conventional inverter. Each device presents an input capacitance. Such increased loading produces a further desirable increase in signal propagation delay.

The output of stacked inverter 40 can be coupled to the input of another stacked inverter, as in the circuits of FIGS. 1–3, to achieve larger signal delay values. In the example of FIG. 4, the output is taken at the coupling of a p-type device to an n-type device.

Figure 5:
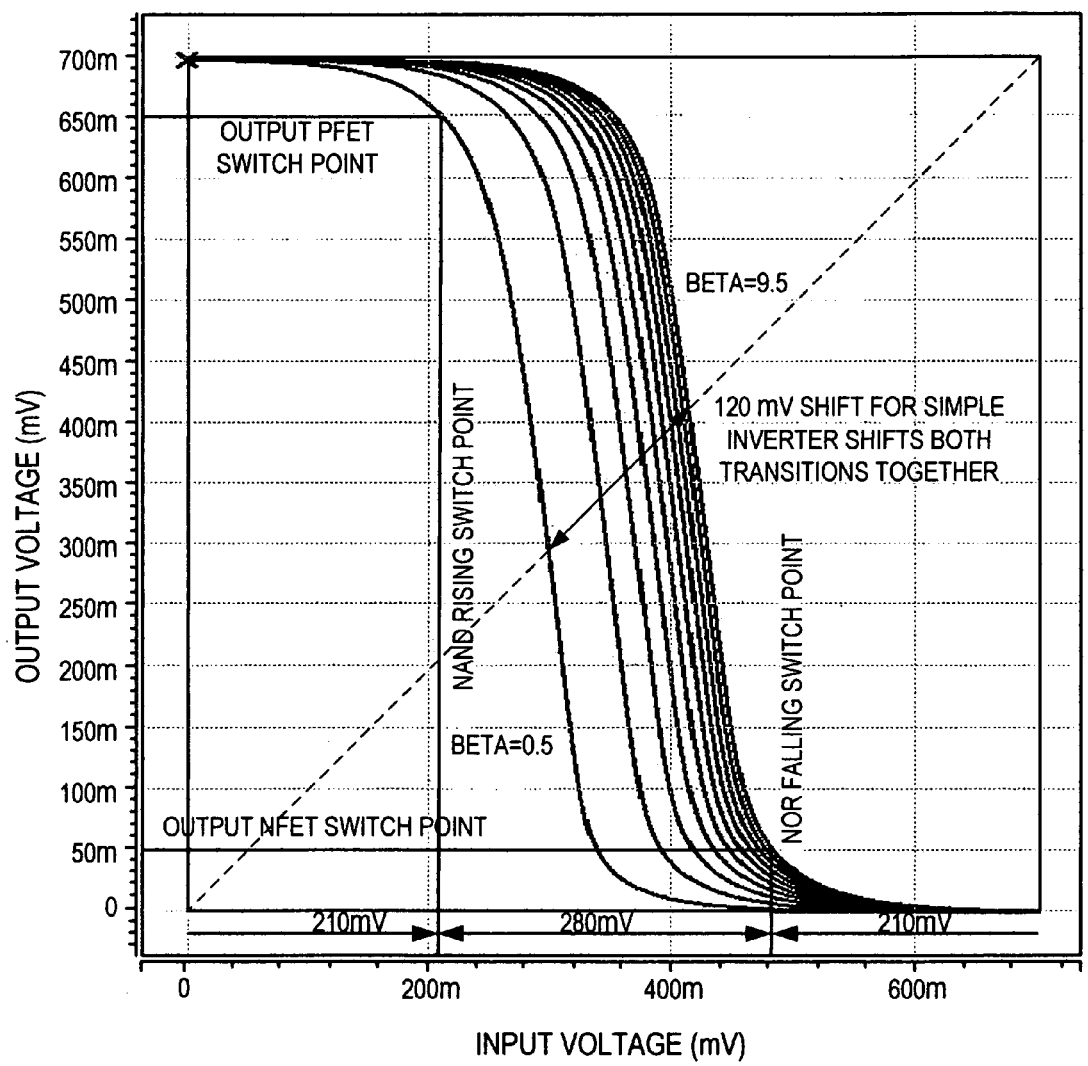
FIG. 5 is a curve of inverter voltage in versus voltage out in accordance with embodiments of the present invention.

FIG. 5 is an exemplary inverter transfer curve for a 700 millivolt (mV) power supply (Vdd) showing voltage in versus voltage out for various values of β in accordance with embodiments of the present invention. FIG. 5 illustrates that, for small voltage shifts on the input, there is no response on the output until the mid-range of the voltage is reached, at which point a relatively large shift is realized. Ordinarily, for static circuits, the input switch point is defined as the point where the input voltage equals the output voltage, so that the switching point shifts only a little as a function of β. However, referring also to FIGS. 1–3, the NAND gate 15 and the NOR gate 24 are only driving individual transistors (transistors 16 and 25, respectively), and therefore it is not necessary for the output voltages of the logic gates 15 and 24 to reach their respective input voltages in order for circuits 10, 35 or 36 to function. Instead, the logic gates 15 and 24 only need to drive to the switch points (the threshold voltages) of the respective output transistors 16 and 25.

Looking at FIG. 5, with reference also to FIGS. 1–3, the output pFET switch point (e.g., transistor 16) is approximately 50 mV below Vdd. For the curve of β equal to 0.5, this reduces the rising switch point of the NAND gate 15 by about 140 mV from Vdd/2, to about 210 mV. The output nFET switch point (e.g., transistor 25) and the falling switch point of the NOR gate 24 are affected in a similar manner with β equal to 9.5.

Thus, for an output pFET, the input voltage switch point moves approximately 140 mV in the advantageous direction (that is, down) from Vdd/2 for a 700 mV power supply. Similarly, for an output nFET, the input voltage switch point moves approximately 140 mV up from Vdd/2 for a 700 mV power supply. Consequently, the input switching point is approximately one-third and two-thirds of Vdd for a pFET output and an nFET output, respectively. Thus, the switch points are advantageously moved a relatively far distance apart from each other. Another advantage is that a reduced portion of a transition (rising or falling) is required in order for circuits 10, 35 and 36 (FIGS. 1–3) to operate. That is, the logic gates 15 and 24 will operate at lower voltages, and so the circuits 10, 35 and 36 will detect a transition earlier and thus can assist the transition earlier.

To summarize, with any of the circuits 10, 35 and 36 of FIGS. 1–3 connected to a wire that is propagating a signal, as the signal begins to transition, the circuit does not fight the transition because its main outputs (transistors 16 and 25) are in a high impedance state (they are shut down). Once the input switch point is reached (at either NAND gate 15 or NOR gate 24, depending on whether there is a rising or a falling transition), the appropriate output transistor (transistor 16 or 25, respectively) is turned on to assist the transition, and then turned off again. Circuits 10 and 35 maintain the current output state (high or low) to continue to help drive the wire.

Repeater Circuit Having Different Operating and Reset Voltage Ranges

Figure 6:
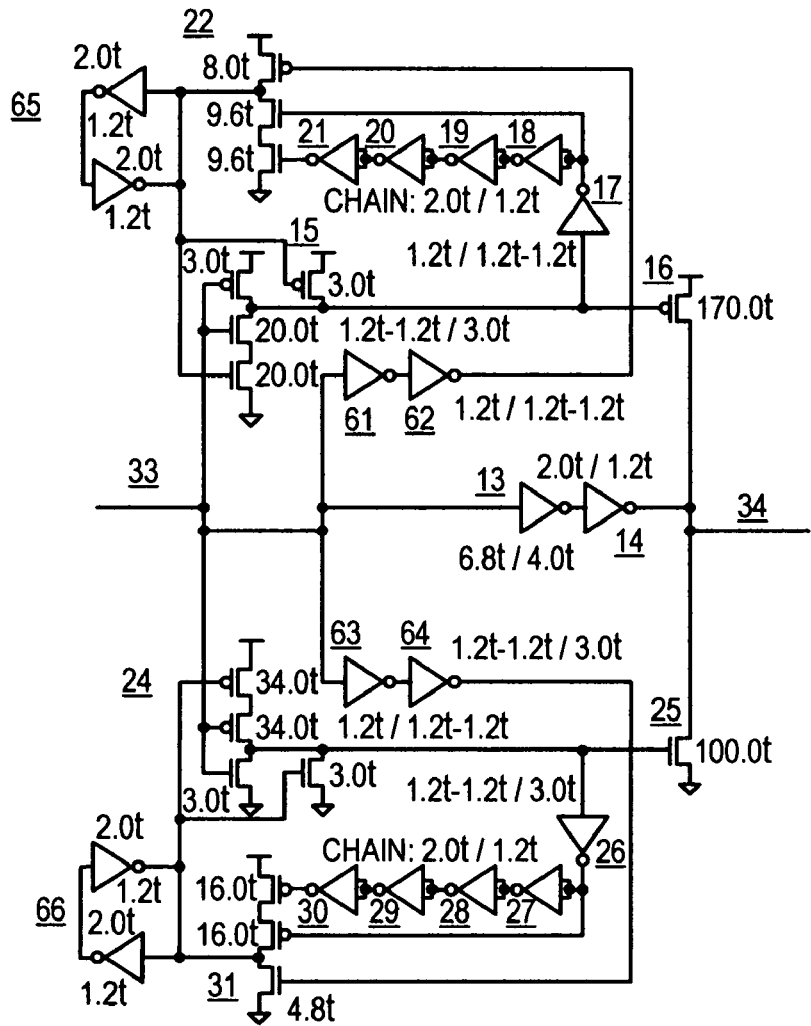
FIG. 6 illustrates a schematic of an embodiment of a circuit for assisting signal transitions where the circuit includes reset circuitry in accordance with the present invention.

FIG. 6 illustrates a schematic of an embodiment of a circuit 60 for driving wire signals and assisting signal transitions in accordance with the present invention. Circuit 60 differs from circuit 10 of FIG. 1 in that the keeper circuitry includes only inverters 13 and 14. Also, circuit 60 includes full latches 65 and 66 instead of half latches; however, half latches could be used in circuit 60 instead of half latches. Other elements common to circuits 10 and 60 are numbered the same. Circuit 60 is not limited to the elements illustrated in the example of FIG. 6; that is, variations in the design of circuit 60 may be permitted while keeping with the functions performed by circuit 60. Circuit 60 can be implemented as a wire repeater or accelerator when coupled to a wire on a chip, in a manner similar to that of circuit 10. Also, in one embodiment, the keeper circuitry (e.g., inverters 13 and 14) is omitted, in a manner similar to that illustrated above in FIG. 3.

Another difference between circuit 60 and circuit 10 is that circuit 60 includes two additional subcircuits, referred to herein as rising transition reset circuitry and falling transition reset circuitry. In the example of FIG. 6, the rising transition reset circuitry includes a reset chain that consists of inverters 61 and 62, and the falling transition reset circuitry includes a reset chain that consists of inverters 63 and 64. The rising transition reset circuitry is for resetting the rising transition circuitry, and the falling transition reset circuitry is for resetting the falling transition circuitry.

As described above in conjunction with FIG. 1, the keeper circuitry of circuit 10 is used for resetting the rising and falling transition subcircuits. For a 700 mV power supply, the rising and falling transition subcircuits are reset by the keeper circuitry of circuit 10 at about 350 mV. As described above in conjunction with FIG. 5, the rising and falling transition subcircuits operate at about one-third and two-thirds of Vdd, respectively. The introduction of the separate rising and falling transition reset circuits addresses an operating scenario in which the rising and falling transition subcircuits of circuit 10 are above their respective switch points but less than the reset point. Such a scenario may occur as a result of a relatively slow transition, and may result in oscillations in the range between the operating and reset switch points. While such oscillations are undesirable because they can waste power and can generate glitches at output 34, they otherwise do not affect the operability of circuit 10.

Circuit 60 is dimensioned such that the reset points of the rising and falling transition reset subcircuits are advantageously shifted so that their respective operating ranges do not overlap the respective operating ranges of rising and falling transition subcircuits. In FIG. 6, 't' is an arbitrary unit of device width.

The operating ranges for a 700 mV power supply according to one embodiment of the present invention are shown in Table 1.

TABLE 1

Exemplary Operating Ranges for a 700 mV Power Supply

| Range | Operation |
| --- | --- |
| less than 200 mV | the rising transition reset circuitry operates to reset the rising transition circuitry |
| greater than 220 mV | the rising transition circuitry operates to assist a rising transition and drive the wire |
| less than 460 mV | the falling transition circuitry operates to assist a falling transition and drive the wire |
| greater than 500 mV | the falling transition reset circuitry operates to reset the falling transition circuitry |

Note that, in the present embodiment, the ranges for the rising transition circuitry and the rising transition reset circuitry not only do not overlap, but some margin is included between the ranges. The same is true for the falling transition circuitry and for the falling transition reset circuitry. The voltage ranges are controlled by β ratios, which are well-preserved and track well on modern complementary metal oxide semiconductor (CMOS) chips, so there is good semiconductor process tracking.

Also, to help suppress oscillations, the rising and falling reset voltages are far apart, so that there is substantial hysteresis in the circuit 60. In the present embodiment, for a 700 mV power supply, the input (rising or falling) must increase to approximately two-thirds of Vdd before the complementary (opposite) transition circuit (falling or rising, respectively) is activated.

Figure 7:
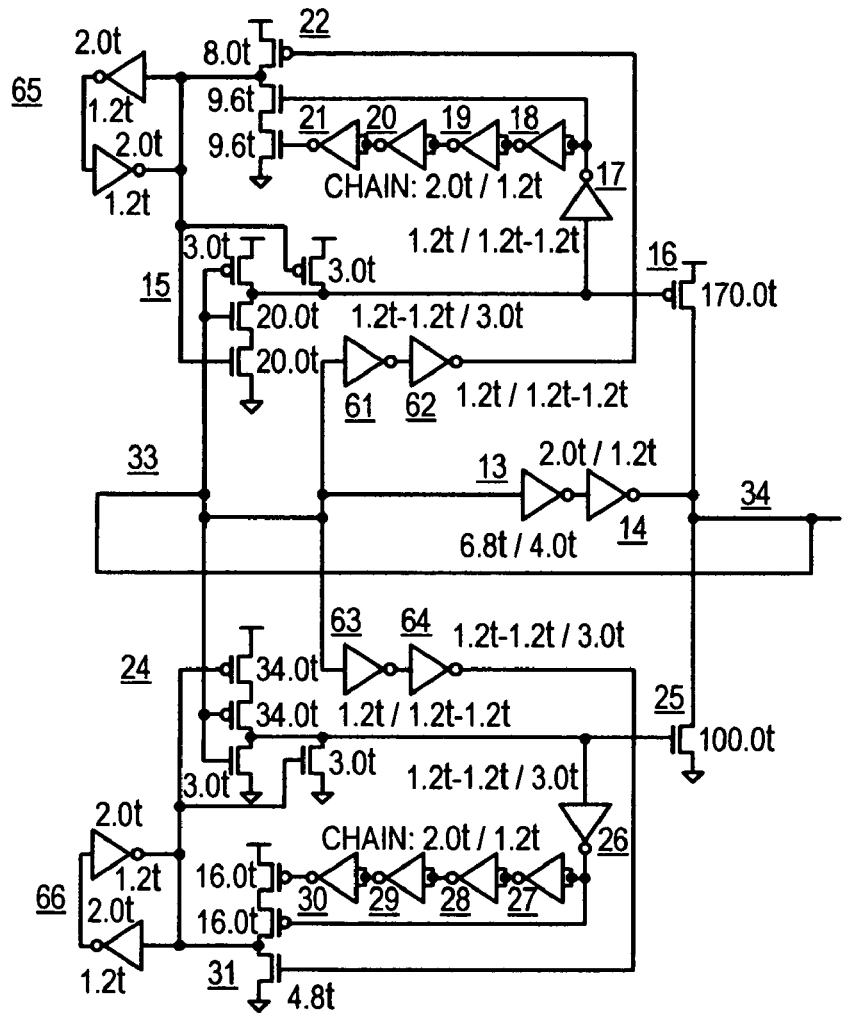
FIG. 7 illustrates a schematic of another embodiment of a circuit for assisting signal transitions where the circuit includes reset circuitry in accordance with the present invention.

FIG. 7 illustrates a schematic of an embodiment of a circuit 70 for driving wire signals and assisting signal transitions in accordance with the present invention. Circuit 70 differs from circuit 60 of FIG. 6 in that the input node 33 and output node 34 of circuit 70 are connected to each other in a lookaside configuration. Elements common to circuits 60 and 70 are numbered the same. Circuit 70 can be implemented as a lookaside wire repeater or accelerator when coupled to a wire on a chip. In one embodiment, the keeper circuitry (e.g., inverters 13 and 14) is omitted, in a manner similar to that illustrated above in FIG. 3.

When multiples of circuit 70 are connected to the same wire, the possibility of an oscillation occurring between the multiple circuits is essentially eliminated by the large hysteresis mentioned above. Oscillations are unlikely because one of the circuits would have to be at one extreme of the operating voltage range at the same time the next circuit is at the other extreme of the operating voltage range. In the event of an oscillation, the system will decay to a stable condition as the adjacent circuits cycle at different rates.

Figure 8:
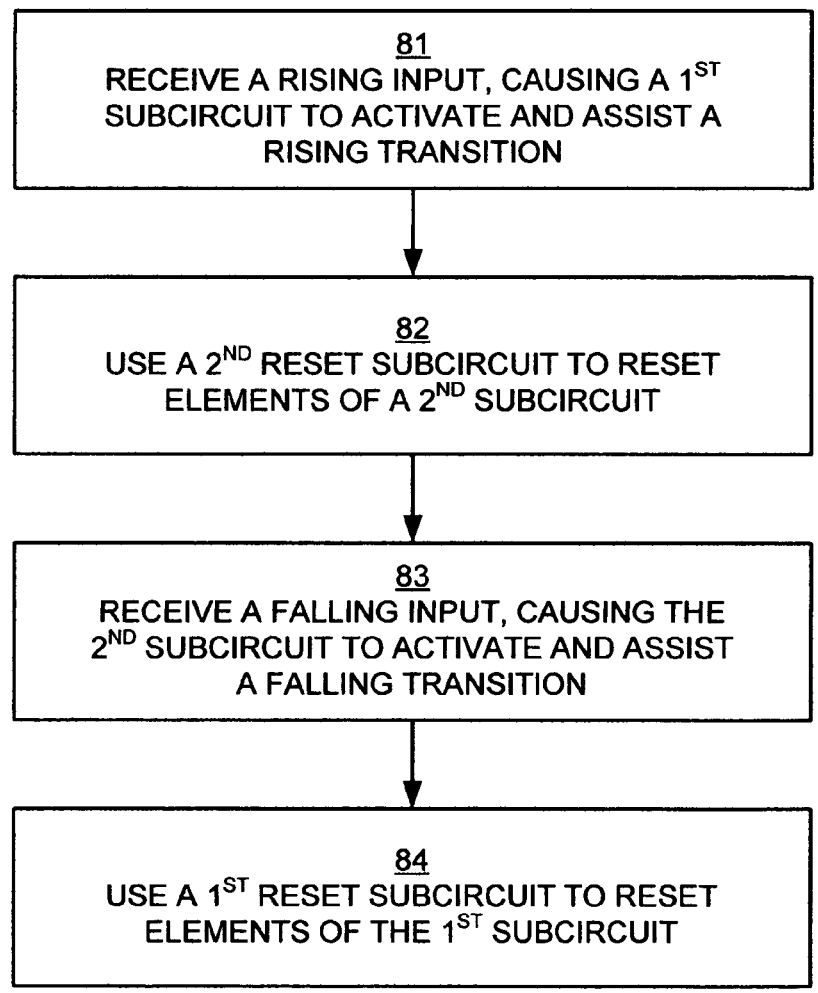
FIG. 8 is a flowchart of a method for assisting signal transitions in accordance with one embodiment of the present invention.

FIG. 8 is a flowchart 80 of a method for assisting signal transitions in accordance with one embodiment of the present invention. Although specific steps are disclosed in flowchart 80, such steps are exemplary. That is, embodiments of the present invention are well-suited to performing various other steps or variations of the steps recited in flowchart 80. It is appreciated that the steps in flowchart 80 may be performed in an order different than presented, and that not all of the steps in flowchart 80 may be performed.

In step 81, a rising input is received at a circuit coupled to a wire. The rising input indicates a rising transition on the wire. The rising input causes a first transistor in a rising transition subcircuit of the circuit to turn on for a period of time to drive the output of the circuit to a high state to assist the rising transition. The first transistor is then turned off. The rising transition subcircuit operates above a first threshold voltage.

In step 82, elements of a falling transition subcircuit are reset using a falling transition reset subcircuit. The falling transition reset subcircuit operates above a second threshold voltage.

In step 83, a falling input is received at the circuit indicating a falling transition on the wire. The falling input causes a second transistor in the falling transition subcircuit to turn on for a period of time to drive the output to a low state to assist the falling transition. The second transistor is then turned off. The falling transition subcircuit operates below the second threshold voltage.

In step 84, elements of the rising transition subcircuit are reset using a rising transition reset subcircuit. The rising transition reset subcircuit operates below the first threshold voltage.

Figure 9:
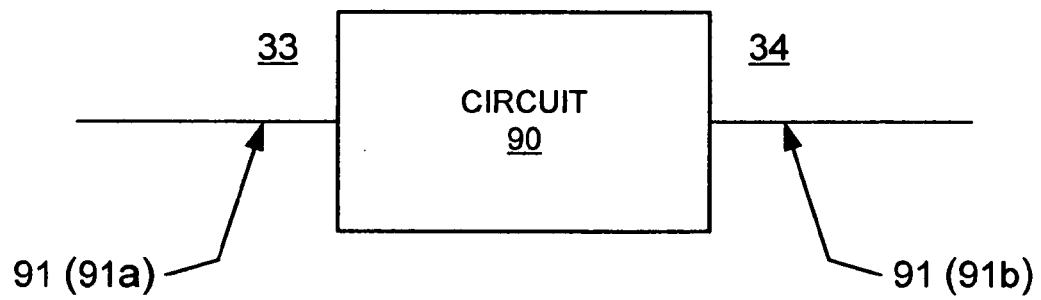
FIG. 9 is a block diagram illustrating a circuit coupled to a wire according to one embodiment of the present invention.

FIG. 9 illustrates a circuit 90 such as circuit 60 or 70 of FIGS. 6 and 7, respectively, coupled to a wire 91 in a "feed through" fashion according to one embodiment of the present invention. In the example of FIG. 9, the wire 91 actually consists of a first portion (91a) and a second portion (91b). A signal on wire 91 enters circuit 90 at input 33 and exits at output 34. According to embodiments of the present invention, circuit 90 acts as a wire repeater/accelerator to assist a rising or falling signal transition on the wire 91, as described above. In various embodiments, a signal on the wire 91 is also driven by the circuit 90 as described above.

Figure 10:
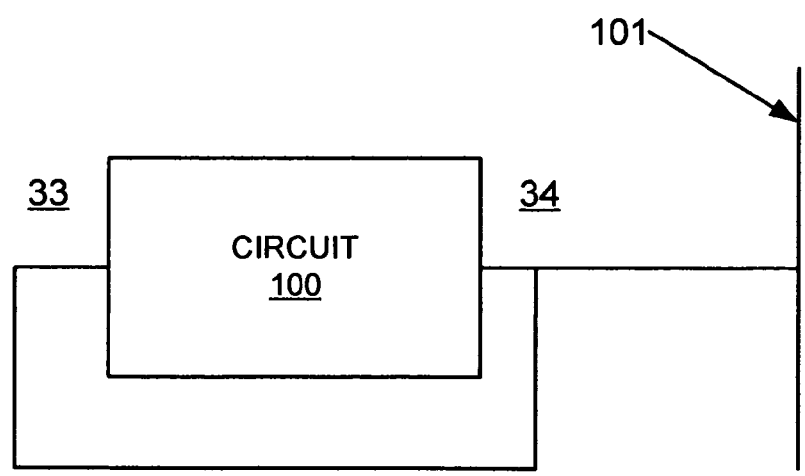
FIG. 10 is a block diagram illustrating a circuit coupled to a wire according to another embodiment of the present invention.

FIG. 10 illustrates a circuit 100 such as circuit 60 or 70 of FIGS. 6 and 7, respectively, coupled to a wire 101 in a "lookaside" fashion according to one embodiment of the present invention. A signal on wire 101 enters circuit 100 at input 33 and exits at output 34. According to embodiments of the present invention, circuit 100 acts as a wire repeater/accelerator to assist a rising or falling signal transition on the wire 101, as described above. In various embodiments, a signal on the wire 101 is also driven by the circuit 100 as described above.

In summary, embodiments of the present invention provide circuits (e.g., wire accelerators and repeaters), and methods thereof, for assisting signal transitions on a wire (such as a wire on a chip). Circuit embodiments in accordance with the present invention can both drive a signal on the wire and assist during wire transitions, without resisting the transitions. Separate reset subcircuits with non-overlapping voltage ranges are used to prevent oscillations from occurring in the circuit.

Embodiments in accordance with the present invention are thus described. While the present invention has been described in particular embodiments, it should be appreciated that the present invention should not be construed as limited by such embodiments, but rather construed according to the below claims.

What is claimed is:

1. A device comprising:
    a wire for propagating a signal; and
    a circuit coupled to said wire, said circuit operable to detect a transition in a signal on said wire, said circuit further operable to assist said transition and to drive said signal after said transition, said circuit assisting said transition and driving said signal with said circuit operating within a first voltage range and said circuit being reset for a subsequent transition with said circuit operating within a second voltage range that does not overlap said first voltage range and wherein there is a gap in voltages between said first and second voltage ranges providing a margin between said ranges.

2. The device of claim 1 wherein said transition is a rising transition and wherein said circuit comprises:
    a rising transition subcircuit coupled to said wire and that operates in a range above a threshold voltage; and
    a reset subcircuit coupled to said rising transition subcircuit and that operates in a range below said threshold voltage.

3. The device of claim 2 wherein said reset circuit comprises a plurality of inverters and wherein said rising transition circuit comprises:
    a NAND gate coupled to said inverters;
    a delay chain coupled to said NAND gate; and
    a p-type transistor coupled to said NAND gate.

4. The device of claim 1 wherein said transition is a falling transition, wherein said circuit comprises:
    a falling transition subcircuit coupled to said wire and that operates in a range below a threshold voltage; and
    a reset subcircuit coupled to said falling transition subcircuit and that operates in a range above said threshold voltage.

5. The device of claim 4 wherein said reset circuit comprises a plurality of inverters and wherein said rising transition circuit comprises:
    a NOR gate coupled to said inverters;
    a delay chain coupled to said NOR gate; and
    an n-type transistor coupled to said NOR gate.

6. The device of claim 1 wherein said circuit comprises a subcircuit for maintaining state at the output of said circuit.

7. The device of claim 1 wherein an input of said circuit is connected to an output of said circuit, wherein further said input and said output are coupled to said wire in a lookaside configuration.

8. A circuit for assisting signal transitions on a wire, said circuit comprising:
    first circuitry coupled to said wire and for causing a first transistor to turn on in response to a rising transition of a signal on said wire and then to turn off after a period of time, said first transistor driving an output of said circuit to a high state to assist in said rising transition;
    second circuitry coupled to said wire and for causing a second transistor to turn on in response to a falling transition of a signal on said wire and then to turn off after a period of time, said second transistor driving said output to a low state to assist in said falling transition;
    third circuitry coupled to said first circuitry and for resetting elements of said first circuitry, wherein said first circuitry operates above a first voltage threshold and said third circuitry operates below said first voltage threshold; and
    fourth circuitry coupled to said second circuitry and for resetting elements of said second circuitry, wherein said second circuitry operates below a second voltage threshold and said fourth circuitry operates above said second voltage threshold.

9. The circuit of claim 8 wherein said third circuitry comprises a first plurality of gates and said fourth circuitry comprises a second plurality of gates.

10. The circuit of claim 8 further comprising fifth circuitry coupled to said wire and for maintaining said high state at said output between said rising transition and said falling transition and for maintaining said low state between said falling transition and a next rising transition.

11. The circuit of claim 10 wherein said fifth circuitry comprises a plurality of gates.

12. The circuit of claim 8 wherein an input of said circuit is connected to said output, wherein said input and said output are coupled to said wire in a lookaside configuration.

13. The circuit of claim 8 wherein said first circuitry comprises:
    a NAND gate coupled to said wire; and
    a delay chain coupled to said NAND gate.

14. The circuit of claim 8 wherein said first transistor is a p-type device.

15. The circuit of claim 8 wherein said second circuitry comprises:
    a NOR gate coupled to said wire; and
    a delay chain coupled to said NOR gate.

16. The circuit of claim 8 wherein said second transistor is an n-type device.

17. In a circuit coupled to a wire, a method of assisting signal transitions on said wire, said method comprising:
    receiving a rising input at said circuit indicating a rising transition on said wire, said rising input causing a first transistor in a first subcircuit of said circuit to turn on for a period of time to drive an output of said circuit to a high state to assist said rising transition, said first transistor then turned off, wherein said first subcircuit operates above a first threshold voltage;
    receiving a falling input at said circuit indicating a falling transition on said wire, said falling input causing a second transistor in a second subcircuit of said circuit to turn on for a period of time to drive said output to a low state to assist said falling transition, said second transistor then turned off, wherein said second subcircuit operates below a second threshold voltage;
    resetting elements of said first subcircuit using a third subcircuit, said third subcircuit operating below said first threshold voltage; and
    resetting elements of said second subcircuit using a fourth subcircuit, said fourth subcircuit operating above said second threshold voltage.

18. The method of claim 17 wherein said first transistor is coupled to circuitry comprising:
    a NAND gate coupled to said wire; and
    a delay chain coupled to said NAND gate.

19. The method of claim 17 wherein said first transistor is a p-type device.

20. The method of claim 17 wherein said second transistor is coupled to circuitry comprising:
   a NOR gate coupled to said wire; and
   a delay chain coupled to said NOR gate.

21. The method of claim 17 wherein said second transistor is an n-type device.

22. The method of claim 17 further comprising:
   maintaining said output in said high state after said rising transition and before a respective falling transition; and
   maintaining said output in said low state after said falling transition and before a next rising transition.

23. The method of claim 17 wherein said third subcircuit comprises a first plurality of gates and said fourth circuitry comprises a second plurality of gates.

24. The method of claim 17 wherein an input of said circuit is connected to said output, wherein said input and output are coupled to said wire in a lookaside configuration.

* * * * *